United States Patent
Welter

(10) Patent No.: US 8,496,788 B2
(45) Date of Patent: Jul. 30, 2013

(54) METHOD AND DEVICE FOR PRODUCING AND STORING ENERGY

(75) Inventor: Richard Welter, Illkirch-Graffenstaden (FR)

(73) Assignee: IS2 S.A.S., Dieuze (FR)

( * ) Notice: Subject to any disclaimer, the term of this patent is extended or adjusted under 35 U.S.C. 154(b) by 433 days.

(21) Appl. No.: 12/988,710

(22) PCT Filed: Apr. 21, 2009

(86) PCT No.: PCT/IB2009/005303
§ 371 (c)(1), (2), (4) Date: Oct. 20, 2010

(87) PCT Pub. No.: WO2009/130562
PCT Pub. Date: Oct. 29, 2009

(65) Prior Publication Data
US 2011/0033741 A1 Feb. 10, 2011

Related U.S. Application Data

(60) Provisional application No. 61/124,923, filed on Apr. 21, 2008.

(51) Int. Cl.
C07F 15/02 (2006.01)
H01G 9/20 (2006.01)

(52) U.S. Cl.
USPC ............ 204/157.75; 204/157.82; 204/157.89; 204/157.79; 422/186; 422/186.3

(58) Field of Classification Search
USPC ............. 204/157.75, 157.82, 157.89, 157.79, 204/157.87, 157.88, 157.7; 422/186, 186.3
See application file for complete search history.

(56) References Cited

U.S. PATENT DOCUMENTS

| | | | | |
|---|---|---|---|---|
| 2,383,319 A | * | 8/1945 | Kharasch | 204/157.79 |
| 2,383,320 A | * | 8/1945 | Kharasch | 204/157.79 |
| 7,883,610 B2 | * | 2/2011 | Monzyk et al. | 422/186 |
| 2011/0053022 A1 | * | 3/2011 | Patolsky et al. | 429/428 |

FOREIGN PATENT DOCUMENTS

| | | |
|---|---|---|
| JP | 2000 012882 A | 1/2000 |
| JP | 2007 277513 A | 10/2007 |

OTHER PUBLICATIONS

Gad et al, "Thermal stability of poly acryloyl benzoic hydrazide and its complexes with some transition metals," Polymer Degradation and Stability, vol. 68 (2000), pp. 153-158.*
Monfared et al, "Iron (III) aroylhydrazone complexes: Structure, electrochemical studies and catalytic activity in oxidation of olefins," J. of Molecular Catalysis A: Chemical vol. 304 (2009), pp. 139-146.*
Terki et al, "Synthesis and X-ray Structure of a Novel N'-Ferrocenylmethyl-N'phenylbenzohydrazide," Asian J. of Chemistry, vol. 18, No. 3 (2006), pp. 2074-2080.*
D.A.S. Finden, E. Tipping, G.H.M. Jaworski and C.S. Reynolds, Nature, vol. 309, Jun. 28, 1984.
G.K. Oster, G. Oster, J. Am. Chem. Soc., 1959, 81, 5543.

(Continued)

*Primary Examiner* — Keith Hendricks
*Assistant Examiner* — Colleen M Raphael
(74) *Attorney, Agent, or Firm* — Davis & Bujold, PLLC

(57) ABSTRACT

A method and a device for producing and storing electrical energy using iron complexes, using an iron +III molecular complex as well as a photoreduced iron +II complex, both complexed chemically by a ligand of the benzoic hydrazide type.

13 Claims, 3 Drawing Sheets

OTHER PUBLICATIONS

E.L. Wehry, R.A. Ward, Inorg. Chem., 1971, 10 12 2660.
B.C. Faust and R.G. Zepp, Environ. Sci. Technol., 1993, 27, 2571.
J. Sima and J. Makanova, Coordination Chemistry Reviews, 160, 1997, 161.
L. Emmenegger, R. Schnoenberger, L. Sigg and B. Sulzberger, Limnol. Oceanogr., 46(1), 2001, 49.
J. Sima, L. Horvathova, M. Izakovic, Monat. Chem., 2004, 135, 5.
Beghidja et al.: "Une etude structurale de lignds derivant de l'acide 2-hydroxy hydrazide benzoique: utilisation pour l'elaboration de nouveaux complexes molecularies magnetiques", Comptes Rendus—Chimie, Elsevier, Paris, France.
Jozef Sima, Mario Izakovic, Martin Zitnansky: "Mechanism of Deactivation Processes of Exited Iron (III) Thiocyanato Complexes with Benacen-Type Ligands", International Journal of Photoenergy, vol. 2006, 2006, pp. 1-5.
Apurba K. Patra, Marilyn M. Olmstead and Pradip K. Mascharak: "Spontaneous Reduction of a Low-Spin Fe (III) Comples o fa Neutral Pentadentate N5 Schiff Base Ligand and the Corresponding Fe (II) Species in Acetonitrile", Inorganic Chemistry, vol. 41, No. 21, Sep. 6, 2002, pp. 5430-5409.

* cited by examiner

METHOD AND DEVICE FOR PRODUCING AND STORING ENERGY

This application is a National Stage completion of PCT/IB2009/005303 filed Apr. 21, 2009, which claims priority from U.S. provisional application Ser. No. 61/124,923 filed Apr. 21, 2008.

FIELD OF THE INVENTION

The present invention relates to a method for producing and storing electrical energy using complexes of a metal.

It also relates to a device for implementing this method for producing and storing electrical energy.

BACKGROUND OF THE INVENTION

The scientific literature provides some examples of photo-induced reduction. One may in particular quote the following articles:

—D. A. S. Finden, E. Tipping, G. H. M. Jaworski and C. S. Reynolds, *Nature*, Vol. 309, 28 Jun. 1984—; —G. K. Oster, G. Oster, *J. Am. Chem. Soc.* 1959, 81, 5543; E. L. Wehry, R. A. Ward, *Inorg. Chem.*, 1971, 10, 12, 2660—; —B. C. Faust and R. G. Zepp, *Environ. Sci. Technol.* 1993, 27, 2517—; —J. Sima and J. Makanova, *Coordination Chemistry Reviews*, 160, 1997, 161—; —L. Emmenegger, R. Schonenberger, L. Sigg and B. Sulzberger, *Limnol. Oceanogr.*, 46(1), 2001, 49—; et—J. Sima, L. Horvathova, M. Izakovic, *Monat. Chem.*, 2004, 135, 5—.

Nonetheless, none of the described systems presents a sufficient stability that would allow using it both in solution and/or in the solid state.

SUMMARY OF THE INVENTION

The present invention aims to open a new way in the elaboration of simple and economical physico-chemical devices for producing electrical energy using the natural light. Furthermore, the present invention meets fully the reconversion and/or transformation criteria imposed in regard to the preservation of the environment and to the absence of nuisance for the biosphere.

This goal is reached by the method of the invention, characterized in that one uses a molecular iron complex derived from benzoic acid, this complex comprising at least one organic ligand of the benzoic hydrazide type, and one creates oxidoreduction reactions in the molecular iron complex by exposing it to light, under absence of air, and vice-versa by exposing it to air, under absence of light.

In a particularly advantageous way, the organic ligand is chosen among the ligands family defined by the formula:

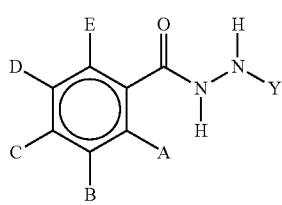

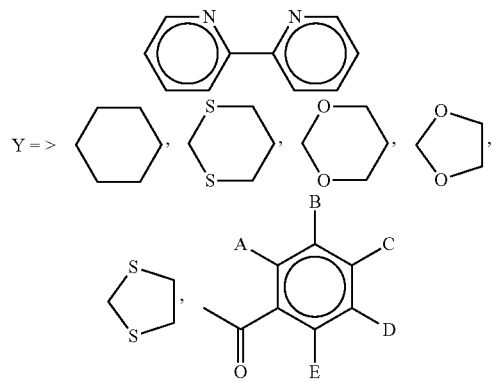

The iron complex is preferably: either the ($Fe^{3+}$) iron complex defined by the formula $[Fe^{III}(HL)_xCl, Solvent]$, or the ($Fe^{2+}$) iron complex defined by the formula $[Fe^{II}(H_2L)_2Cl_2]$. HL and $H_2L$ represent the two chemical states of an organic ligand such as defined previously, depending on whether it is complexed either with oxidized iron or with reduced iron. So, $H_2L$ relates to a state in which a hydrogen atom is present on the central nitrogen atom, while HL relates to a state in which the hydrogen atom is absent on this same nitrogen atom.

According to an embodiment, one produces a reduction of the ($Fe^{3+}$) iron in the $[Fe^{III}(HL)_xCl, Solvent]$ complex into ($Fe^{2+}$) iron in the $[Fe^{II}(H_2L)_2Cl_2]$ complex by exposing it to light in the absence of oxygen.

According to another embodiment, one produces an oxidation of the ($Fe^{2+}$) iron in the $[Fe^{II}(H_2L)_2Cl_2]$ complex into ($Fe^{3+}$) iron in the $[Fe^{III}(HL)_xCl, Solvent]$ complex by creating a chemical or electrochemical contact with an oxidant, in the absence of light.

Advantageously, the oxidant can be chosen from the group: $O_2$, $I_2$, $Cu^{2+}$, $Co^{3+}$, $FeCl_3$, $H^+$, manganate and permanganate, ferrates.

Advantageously, the solvent can be chosen among the following solvents: dimethylformamide (DMF), tetrahydrofuran (THF), ethanol, water.

It is also reached by the device of the invention, characterized in that it comprises a molecular iron complex comprising at least one organic ligand of the benzoic hydrazide acid type.

The organic ligand is advantageously chosen among the ligands family defined by the following formula:

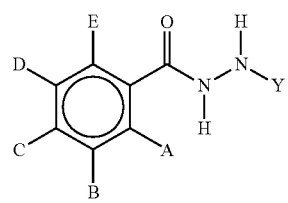

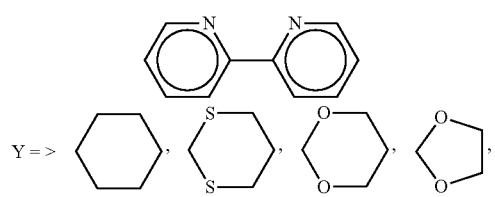

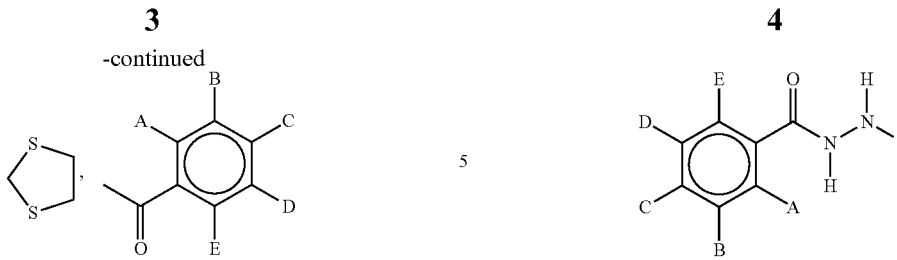

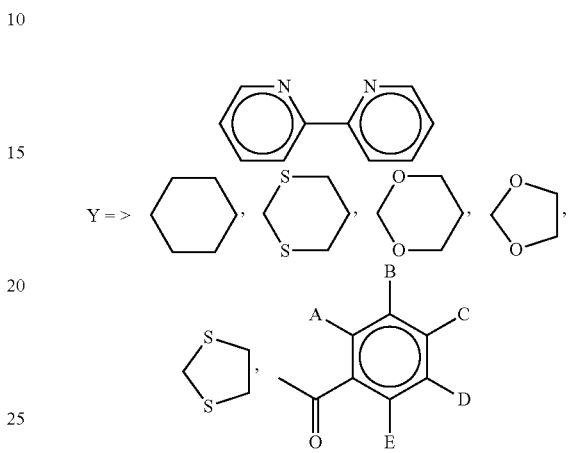

According to a particularly advantageous embodiment, the iron complex is: either the ($Fe^{3+}$) iron complex defined by the formula [$Fe^{III}(HL)_xCl$, Solvent], or the ($Fe^{2+}$) iron complex defined by the formula [$Fe^{II}(H_2L)_2Cl_2$]. HL and $H_2L$ represent the two chemical states of an organic ligand such as defined previously, depending on whether it is complexed either with an oxidized iron with reduced iron. So, $H_2L$ relates to a state in which a hydrogen atom is present on the central nitrogen atom, while HL relates to a state in which the hydrogen atom is absent on this same nitrogen atom.

According to an embodiment, the device comprises advantageously means for producing a reduction of the ($Fe^{3+}$) iron in the [$Fe^{III}(HL)_xCl$, Solvent] complex into ($Fe^{2+}$) iron in the [$Fe^{II}(H_2L)_2Cl_2$] complex, these means involving an exposition to light, in the absence of an oxidant, of the ($Fe^{3+}$) iron complex.

According to another embodiment, the device comprises advantageously means for producing an oxidation of the ($Fe^{2+}$) iron in the [$Fe^{II}(H_2L)_2Cl_2$] complex into ($Fe^{3+}$) iron in the [$Fe^{III}(HL)_2Cl$, Solvent] complex, these means involving an action of a suitable oxidant, in the absence of light, on the ($Fe^{2+}$) iron complex.

BRIEF DESCRIPTION OF THE DRAWINGS

The present invention and its advantages will be better revealed in the following description of several embodiments given as non limiting examples, in reference to the drawings in appendix, in which.

DETAILED DESCRIPTION OF THE PREFERRED EMBODIMENTS

One knows, through various publications, that the organic ligands of the benzoic hydrazide acid type complex many transition metals such as iron, manganese, particularly at their usual oxidation levels, (2+) or (3+). These ligands, which derive from benzoic acid, have already been synthesized, purified and characterized in laboratory, by means of the various spectroscopic and X-Ray diffraction methods.

As a non-limiting example, a selection of this type of ligands is given by the formulas below:

Complexing tests carried out in laboratory with various manganese ($Mn^{2+}$), ($Mn^{3+}$), chromium ($Cr^{3+}$), copper and iron ($Fe^{3+}$) salts led to new mononuclear complexes, with original structures. Tests have in particular been carried out with iron and allowed to ascertain that, in a [$Fe^{III}(HL)_2Cl$, Solvent] complex designated by $C_1$, a reduction of the ($Fe^{3+}$) iron took place in certain conditions to produce a new ($Fe^{2+}$) iron complex [$Fe^{II}(H_2L)_2Cl_2$] designated by $C_2$ and vice-versa, by modifying the conditions.

The $C_1$ complex can be obtained in solid state from a slow diffusion of diethyl ether in the solvent, which is dimethylformamide (DMF). The reaction takes place in the air and in absence of light. This reaction is materialised by the formation of night blue monocrystals of the $C_1$ complex.

An exposition of the mixture to the air in the absence of light, i.e. in conditions opposite to those that allowed forming the $C_1$ complex, leads to the formation of a yellow solution, then to a crystallisation in the form of yellow crystals of the $C_2$ complex. These yellow crystals, obtained after a slow diffusion of diethyl ether in the DMF solution, are air-sensitive. In fact, in presence of the oxygen of the air, their color changes and they convert into a blue solid. Furthermore, the solubilisation of the yellow monocrystals corresponding to the $C_2$ complex in the DMF solution in presence of air gives instantaneously a blue solution corresponding to the $C_1$ complex. The change from one of the complexes to the other is reversible.

Figure 1:
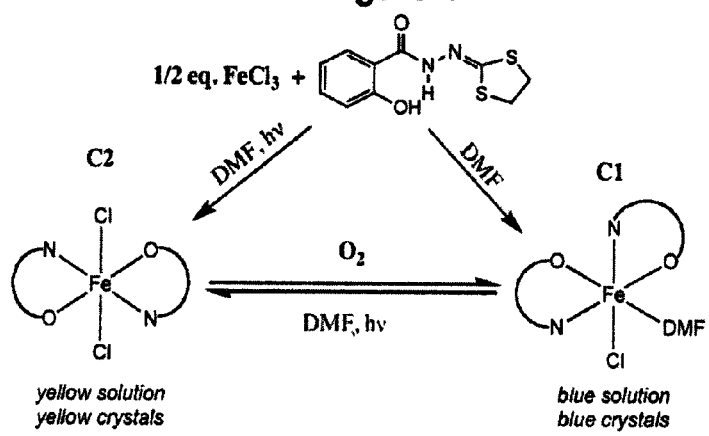
FIG. 1 is a schematic view representing the transformation of the ($Fe^{2+}$) iron complex into the ($Fe^{3+}$) iron complex and vice versa.

FIG. 1 represents schematically this transformation. The basic reaction takes place between a $H_2L$ ligand and iron chloride $FeCl_3$ in presence of the DMF solvent. One produces the $C_1$ and $C_2$ complexes. The $C_1$ complex exposed to light, but in the absence of air, converts by photoreduction in $C_2$ complex. In the absence of light, but exposed to the air, more precisely to the oxygen of the air, the $C_2$ complex converts by oxidation to $C_1$ complex. This reversible transformation is due to oxidation and reduction reactions linked with the presence or the absence of light and the presence or not of oxygen. The reactions may be monitored experimentally because of the color changes that accompany the diffusion process of the diethyl ether, which is a colorless liquid, in a DMF solution.

Figure 2:
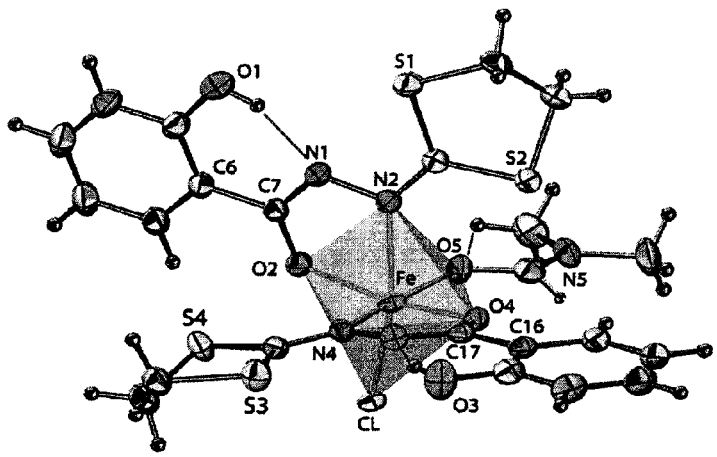
FIG. 2 is a view representing a molecule of the ($Fe^{3+}$) iron complex.

FIG. 2 is a schematic view that illustrates the molecular structure of the $C_1$ complex. The ellipsoids contain 50% of the electron density. The dashed lines represent the intramolecular hydrogen bonds. Some bond lengths (Å) and some angles (°) are given here: Fe—O2, 1.973 Å (4); Fe—O4, 1.977 Å (4); Fe—O5, 2.035 Å (4); Fe—N4, 2.145 Å (5); Fe—N2, 2.213 Å (5); Fe—Cl, 2.3318 Å (14); O2-Fe—O4, 159.84° (17); O5-Fe—N4, 166.56° (17).

Figure 3:
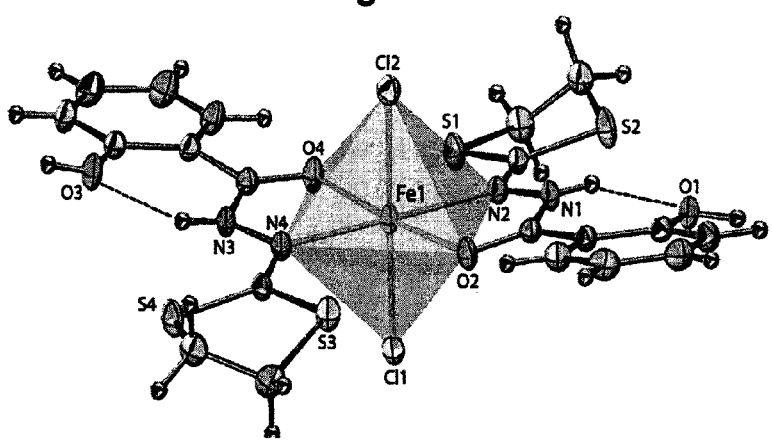
FIG. 3 is a view representing a molecule of the ($Fe^{2+}$) iron complex.

FIG. 3 is a schematic view that illustrates the molecular structure of the $C_1$ complex. The ellipsoid contains 50% of the electron density. The dashed lines represent the intramolecular hydrogen bonds. Some bond lengths (Å) and some angles (°) are given here: Fe1-O2, 2.115 Å (1); Fe1-O4, 2.122 Å (1); Fe1-N4, 2.199 Å (1); Fe1-N2, 2.229 Å (1), Fe1-Cl1 2.4396 Å (7), Fe1-Cl2 2.4613 Å (7); O2-Fe1-O 4, 175.41° (4); O4-Fe1-N4, 74.55° (4). The presence or not of a hydrogen atom on the central nitrogen allows confirming the charge ($Fe^{2+}$) or ($Fe^{3+}$) of the iron atoms.

Figure 4:
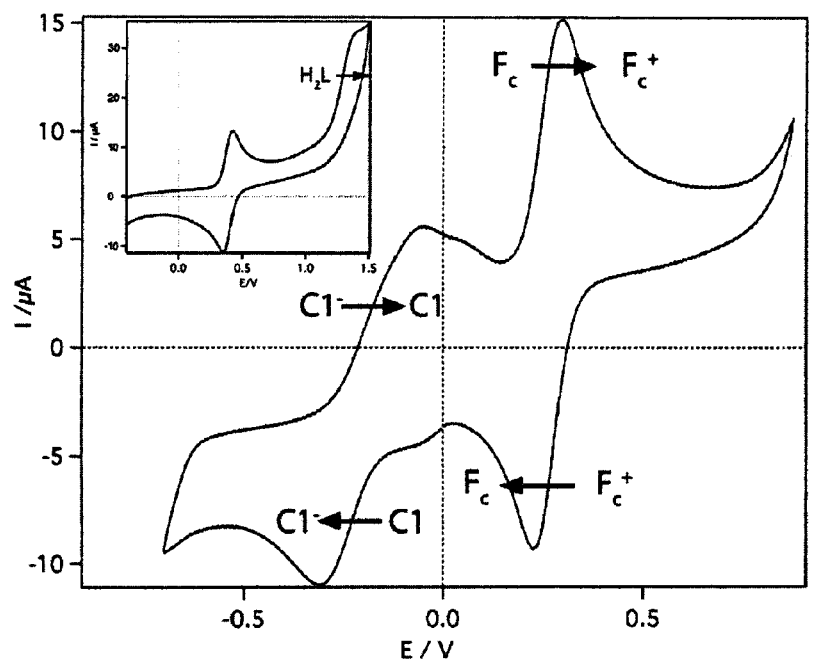
FIG. 4 represents a cyclovoltammogram of the ($Fe^{3+}$) iron complex.

FIG. 4 represents a cyclovoltammogram of the $C_1$ complex (1 mM) in the DMF with a platinum electrode, a supporting electrolyte nBU4 PF6 0.2 M and a scanning speed of 100 mV·s$^{-1}$). The cyclovoltammogram of the $H_2L$ ligand is represented as an insert and in the same experimental conditions.

Figure 5:
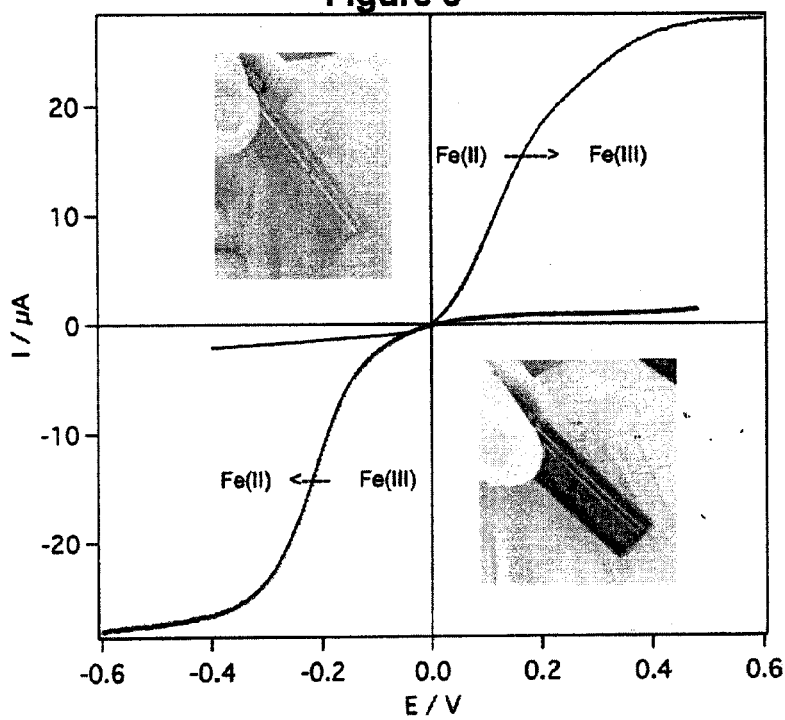
FIG. 5 represents the intensity/potential curves measured on a quasi-static electrode out of glassy carbon for the ($Fe^{3+}$) iron complex and the ($Fe^{2+}$) iron complex.

FIG. 5 represents the intensity/potential curves measured on a quasi-static electrode out of glassy carbon for the $C_1$ complex and for the $C_2$ complex in the DMF solution with a supporting electrolyte nBU$_4$NPF$_6$, 0.2 M, a scanning speed of 2 mV·s$^{-1}$ and a rotational speed of 1000 rpm.

According to the electrochemical study summarized in FIGS. 4 and 5, the $C_1$ complex has been studied by cyclic voltamperometry, as well as by pseudo stationary voltamperometry. In both cases, the presence of ferrocene in the medium shows a good validity of the electrochemical measurements. The electrochemical signature of the $C_1$ complex is in line with a reversible $C_1/C_1^-$ system, while the $H_2L$ ligand only shows the oxidation wave of its redox cycle. One can assert that the electrochemical signal of the $C_1/C_1^-$ couple observed by cyclic voltamperometry corresponds to the $C_1/C_2$ redox couple.

The molecular complexes $C_1$ and $C_2$, besides their easy synthesis and their chemical stability, absorb the light in the near ultra-violet range, i.e. radiation with a wavelength located approximately between 300 and 350 nm. The hydrazide-type ligand is responsible for this absorption in the UV range, in solution as in solid state. The originality of the system lies in the change of the oxidation level that may be used for the circulation of electrons. The ($Fe^{3+}$) iron solution is stable in the absence of light, and the iron +II solution is stable in the absence of air. The yellow ($Fe^{2+}$) iron solution oxidizes very easily in the air. As an experiment, it is sufficient to circulate air during a relatively short interval of time, for example one minute, in a container containing a solution of the $C_2$ complex to transform it into a dark blue solution of the $C_1$ complex. Placed for some hours in the natural light, the dark blue solution of the $C_1$ complex reduces to the yellow solution of the $C_2$ complex. One will note that the solutions build up with water in these conditions because of the reduction of the oxygen ($O_2$) into water ($H_2O$).

In brief, the light absorption of the molecular complexes $C_1$ and $C_2$ is accompanied by a change of the oxidation or reduction level of the metallic center, in this case iron, copper or the like, leading to new stable molecular complexes in solution, as well as in solid state. This phenomenon is a light-induced chemical reduction, accompanied by a spontaneous species separation, the reduced complex on the one hand and the oxidized species on the other hand.

Figure 6:
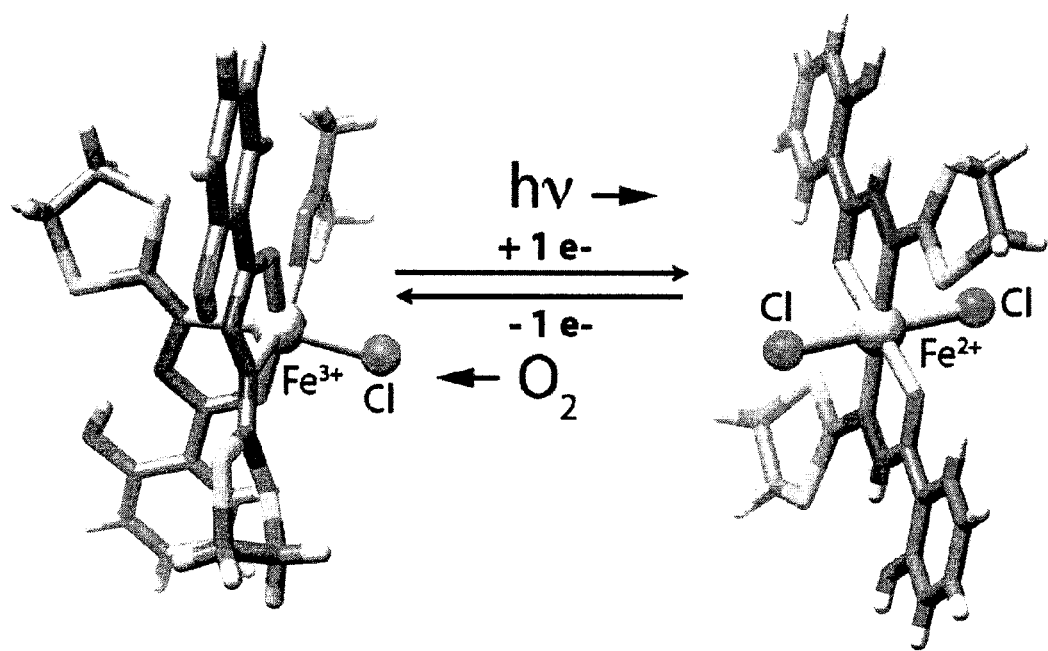
FIG. 6 represents schematically the spontaneous reduction process under natural light according to the invention.

FIG. 6 illustrates the mechanism of the phenomenon. The stability of the reduced form is linked with a molecular reorganisation inducing a change of the apparent potential of the redox system. During the reduction of the Fe ($Fe^{3+}$) into Fe ($Fe^{2+}$), a species is necessarily oxidized in the medium. Considering the chromophoric character of the ligand, one estimates a priori that the latter yields an electron to the metal, but the analyses of the final product, that is the $C_2$ complex in solution and in crystalline state, shows clearly that the molecules of the ligand are not in an oxidized state. The electronic defect thus has been transferred in the medium to the molecules of the solvent, since the metallic center is not re-oxidized spontaneously.

However, this particular situation with an oxidized part transferred to the solvent, which may be DMF, THF, ethanol or water, allows contemplating new types of oxidation-reduction (redox) solar cells with a particularly simple technology. The device according to the invention constitutes a photoreducible system with spontaneous separation of species.

POSSIBILITIES OF INDUSTRIAL APPLICATION

The method and the device of the invention open a new way for the elaboration of simple and economical systems, since the chemical element is iron, for the transformation of light into electricity. At a time where the sources of energy become major stakes, the development of new physico-chemical systems able to transform the energy of light into electrical energy is fundamental. Furthermore, and considering the environmental situation, the new sources of energy or energy-producing systems have and will have to meet criteria of reconversion and/or transformation that will not harm the biosphere.

The present invention is not limited to the exemplary embodiments described, but extends to any modification or variation obvious to a person skilled in the art which remains within the scope of protection defined by the attached claims.

The invention claimed is:

1. A method for producing and storing electrical energy using complexes of a metal, the method comprising the steps of:
   providing a molecular iron complex comprising at least one organic ligand of benzoic hydrazide or a benzoic hydrazide derivative, and
   performing oxidation/reduction reactions in the molecular iron complex by one of exposing the molecular iron complex to light in an absence of air, and exposing the molecular iron complex to air in an absence of light.

2. (The method according to claim 1, further comprising the step of selecting the organic ligand from a ligand defined by a formula:

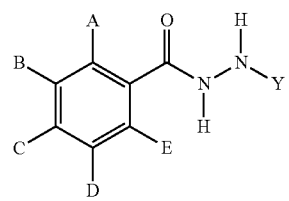

wherein A, B, C, D, E and Y are each selected from the group consisting of H, COOH, OH, F, Cl, Br, I, and/or the following compounds given by the following formulas

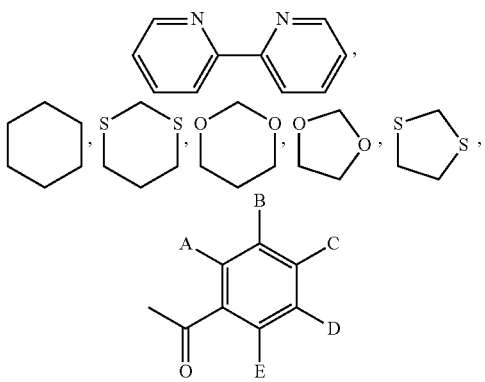

and combinations thereof.

3. The method according to claim 1, further comprising the step of selecting the iron complex from either:
an iron complex ($Fe^{3+}$) defined by a formula $Fe^{III}(HL)_xCl$, in a solvent, or
an iron complex ($Fe^{2+}$) defined by a formula $Fe^{II}(H_2L)_2Cl_2$.

4. The method according to claim 3, further comprising the step of producing a reduction of the iron complex ($Fe^{3+}$) in the $Fe^{III}(HL)_xCl$, in the solvent complex into the iron complex ($Fe^{2+}$) in the $Fe^{II}(H_2L)_2Cl_2$ by exposing this to light in the absence of oxygen.

5. The method according to claim 3, further comprising the step of producing an oxidation of the iron complex ($Fe^{2+}$) in the $Fe^{II}(H_2L)_2Cl_2$ complex iron complex ($Fe^{3+}$) in the $Fe^{III}(HL)_xCl$, solvent complex by creating either a chemical or electrochemical contact with an oxidant in the absence of light.

6. The method according to claim 5, further comprising the step of selecting the oxidant from the group consisting of:
$O_2$,
$I_2$,
$Cu^{2+}$,
$Co^{3+}$,
$FeCl_3$,
$H^+$,
manganate,
permanganate, and
ferrates.

7. The method according to claim 3, further comprising the step of selecting the solvent from the group consisting of:
dimethylformamide (DMF),
tetrahydrofuran (THF),
ethanol, and
water.

8. A device for producing and storing electrical energy, for the implementation of a method comprising the steps of providing a molecular iron complex comprising at least one organic ligand of benzoic hydrazide or a benzoic hydrazide derivative, and performing oxidation/reduction reactions in the molecular iron complex by one of exposing the molecular iron complex to light under absence of air, and exposing the molecular iron complex to air under absence of light, the device comprising
at least one of means for exposing the molecular iron complex to light in the absence of air, and means for exposing the molecular iron complex to air in the absence of light in order to perform the oxidation/reduction reactions.

9. The device according to claim 8, wherein the organic ligand is chosen selected from a ligand ligands family defined by a formula:

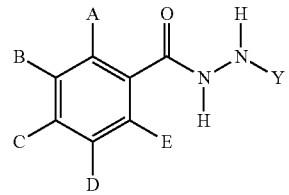

wherein A, B, C, D, E and Y are each selected from the group consisting of H, COOH, OH, F, Cl, Br, I, and/or the following compounds given by the following formulas:

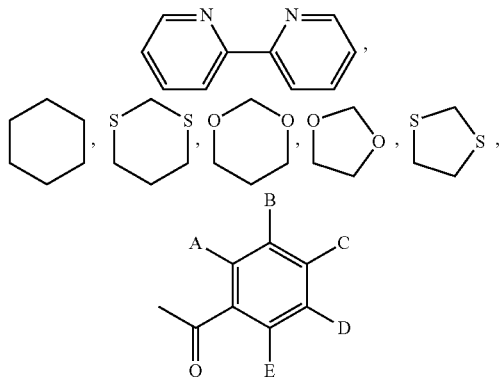

and combinations thereof.

10. The device according to claim 8, wherein the iron complex is either:
an iron complex ($Fe^{3+}$) defined by a formula of $Fe^{III}(HL)_xCl$, in a solvent, or
an iron complex ($Fe^{2+}$) defined by a formula of $Fe^{II}(H_2L)_2Cl_2$.

11. The device according to claim 8, wherein the device comprises a means for producing a reduction of the iron complex ($Fe^{3+}$) in the $Fe^{III}(HL)_xCl$, in the solvent into the iron complex ($Fe^{2+}$) in the $Fe^{II}(H_2L)_2Cl_2$ complex, the means involving an exposition to light in the absence of an oxidant of the iron complex ($Fe^{3+}$).

12. The device according to claim 8, wherein the device comprises a means for producing an oxidation of the iron complex ($Fe^{2+}$) iron in the $Fe^{II}(H_2L)_2Cl_2$ complex into the iron complex ($Fe^{3+}$) in the $Fe^{III}(HL)_xCl$, in a solvent complex, these and the means involving an action of a suitable oxidant in the absence of light on the iron complex ($Fe^{2+}$).

13. A method of producing and storing electrical energy using complexes of a metal, the method comprising the steps of:
providing a molecular iron complex comprising at least one organic ligand of benzoic hydrazide or a benzoic hydrazide derivative;
and one of:
exposing the molecular iron complex to light in an absence of air to perform oxidation/reduction reactions; and
exposing the molecule to air in an absence of light to perform oxidation/reduction reactions.

* * * * *